United States Patent [19]
Kim

[11] Patent Number: 6,060,130
[45] Date of Patent: May 9, 2000

[54] METHOD OF FORMING INSULATION FILMS FOR LIQUID CRYSTAL DISPLAY

[75] Inventor: Jung-Ha Kim, Seoul, Rep. of Korea

[73] Assignee: LG Electronics Inc., Seoul, Rep. of Korea

[21] Appl. No.: 09/132,895

[22] Filed: Aug. 12, 1998

[30] Foreign Application Priority Data

Nov. 3, 1997 [KR] Rep. of Korea .................. 97-57622

[51] Int. Cl.⁷ ........................................... B05D 3/06
[52] U.S. Cl. .................. 427/558; 427/123; 427/331; 427/407.1; 427/419.1; 427/595
[58] Field of Search .................. 427/558, 595, 427/331, 407.1, 419.1, 123

Primary Examiner—Bernard Pianalto

[57] ABSTRACT

A method for forming a silicon oxide film, $SiO_x$, where $X=1$ or 2, on an electrode of a thin film transistor, e.g., for a liquid crystal display device. The method includes the steps of: forming an electrode on a substrate; forming an organic silicon-containing thin film on exposed surfaces of the electrode and the substrate; providing a gaseous atmosphere of oxygen or air about the electrode and the substrate; and irradiating the thin film with ultra violet light to produce radicals, including silicon radicals, from the thin film. The irradiation also produces oxygen radicals from the atmosphere. The silicon and oxygen radicals react to form the silicon oxide.

13 Claims, 3 Drawing Sheets

POLYSILOXANE CINNAMATE COPOLYMER

POLYSILOXANE CINNAMATE

POLY(DIMETHYLSILOXANE)

PHENYL SILANE

N-(TRIMETHYLSILYL) ACETAMIDE

TRIMETHYLSILYL ACETATE 1-(TRIMETHYLSILYL-METHYL) - UREA 1,4-BIS(TRIMETHYLSILYL) - BENZENE

METHOD OF FORMING INSULATION FILMS FOR LIQUID CRYSTAL DISPLAY

BACKGROUND OF THE INVENTION

1. Field of the Invention

The present invention relates to a method of forming insulation films, e.g., for a liquid crystal display, and more particularly to a method of forming insulation films for a liquid crystal display which is adapted to form insulating films without using an expensive apparatus or complicated processes.

2. Description of the Related Art

Generally, amorphous silicon or low temperature polycrystalline silicon is used to form thin film transistors for a liquid crystal display. Polycrystalline silicon has a higher mobility of carriers such as electrons or holes than that of amorphous silicon. Thin film transistors made from the polysilicon can be mounted on a panel without additional driving circuitry. Thus, low temperature polysilicon is widely used for thin film transistors.

The fabrication of thin film transistors using low temperature polycrystalline involves the step of crystallizing amorphous silicon using means such as a laser. This fabrication process also involves forming gate insulating films between gate electrodes and active layers (which were previously obtained by the crystallizing method using the laser), and forming insulating films (such as passivation films used as protection layers covering source/drain electrodes), where the insulating films are composed of silicon oxides or silicon nitrides.

Conventional methods for forming the silicon oxides or silicon nitrides (used for the insulating films) are chemical vapor deposition (CVD) and thermal oxidation. The CVD method forms thin films on an insulation substrate by decomposing and reacting vapor phase compounds. In a CVD reaction chamber, the silicon oxides or silicon nitrides can be formed by supplying silicon gases into an atmosphere of oxygen or nitrogen. At this time, to obtain adhesive thin films, it is necessary to heat the substrate. Also, thermal energy, plasma energy using RF power, laser or Energy of UV light is used to decompose the reacting gas (such as silicon gas) and to accelerate the reactions of atoms or molecules decomposed by the heating of the insulation substrate and to control the physical properties of the thin films formed on the substrate.

Thermal oxidation is an "open-tube" type of reaction performed at atmospheric pressure. There is a dry process and a wet process for thermally oxidizing silicon. The dry process is the more simple thermal oxidation process. It uses only two elements, silicon and oxygen. However, it is a very slow thin film process. The wet process is performed by adding a controlled amount of water vapor to oxygen gas. Its growth rate is increased by the amount of water vapor used.

An important parameter of water vapor oxidation is the partial pressure of water vapor in the atmosphere in which the oxide film is to be formed. One atmospheric pressure is the optimal condition for the oxide film to be formed, e.g., it produces the highest rate of formation.

However, in the conventional method of forming the insulating films for the liquid crystal display where the silicon oxides (forming the gate insulating films and/or passivation layers of the thin film transistors) are formed by a CVD or thermal oxidation method, there is a need to preserve a high vacuum in the reaction chamber. Also, these processes are complicated. Further, it is a problem that these methods necessarily involve expensive devices.

SUMMARY OF THE INVENTION

It is an object of the present invention to provide a method of forming insulating films for electrodes of a thin film transistor (TFT) in a semiconductor device, such as a liquid crystal display, in which the processes are simple and does not need additional expensive apparatus.

The invention forms the insulating films in the atmosphere of air or oxygen, e.g., without having to preserve a vacuum state.

The invention, e.g., provides a method of forming insulating films for a liquid crystal display, comprising the steps of: forming an organic silicon-containing thin film on an insulating substrate; providing a gaseous oxidizing atmosphere to which the thin film is exposed; destroying molecular bonds of the thin film to generate a plurality of radicals comprising Si radicals and O radicals by irradiating UV light onto the organic silicon-containing material thin film, through said atmosphere; and forming the insulating films by reacting the Si radicals and O radicals.

The invention, e.g., also provides a method of a method for forming a silicon oxide film, $SiO_x$, where X=1 or 2 on an electrode of a thin film transistor, the method comprising the steps of: forming an electrode on a substrate; forming an organic silicon-containing thin film on exposed surfaces of said electrode and said substrate; providing a gaseous atmosphere of oxygen or air about said electrode and said substrate; irradiating said thin film with ultra violet light to produce radicals, including silicon radicals, from said thin film and to produce oxygen radicals from said atmosphere; and reacting said silicon and oxygen radicals to form said silicon oxide film.

The foregoing and other objectives of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention and wherein.

DETAILED DESCRIPTION OF THE INVENTION

The present invention will be now explained with reference to the drawings.

Figure 1A:
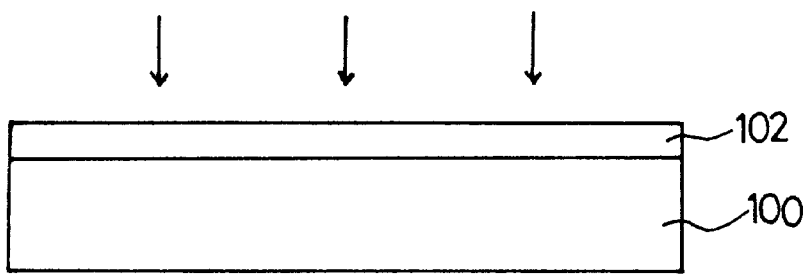
FIGS. 1A and 1B are sectional views illustrating the processes for forming insulating films of liquid crystal display according to the invention.
Figure 1B:
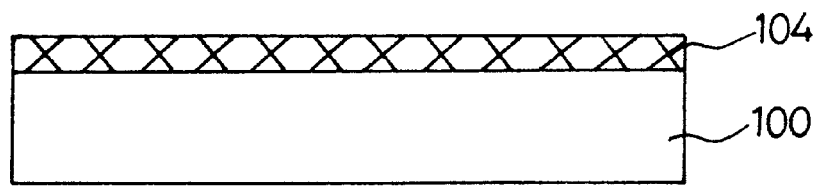

FIGS. 1A and 1B are sectional views showing the process flow for forming the insulating films of liquid crystal display according to the invention and FIGS. 2A, 2B, 2C, 2D, 2E, 2F, 2G, 2H and 2I are structure formulae of an embodiment of the organic materials containing silicon according to the invention.

Although not shown, thin film transistors are respectively formed in pixel regions and driving circuit regions. The thin film transistors comprise gate electrodes patterned on predetermined areas of an insulating or semiconductor substrate, gate insulating films and active layers subsequently stacked on the gate electrodes, and source/drain electrodes patterned to partially expose the active layers. A passivation layer is formed to cover the source/drain electrodes. The process for forming the insulating films (used as gate insulating films) or passivation films according to an embodiment of the invention will be described below in detail.

As shown in FIG. 1A, an organic material containing silicon is formed as a thin film 102 on an insulating substrate 100.

Alternatively, another organic material containing silicon could be formed as a second thin film on the first thin film. In FIG. 1A, for simplicity, the process for forming the gate electrode on the insulation substrate is omitted. After the organic material thin film containing silicon 102 is formed on the insulation substrate 100, it is irradiated by UV light having a wavelength, e.g., less than 210 nm and the power, e.g., of 30 W in an atmosphere, e.g., of air or oxygen (e.g., in this embodiment, the wavelength of UV light is 172 nm).

As shown in FIG. 1B, the bonds of the organic silicon-containing thin film 102 are destroyed by the UV light irradiated thereon, and various radicals are generated. Simultaneously, various radicals, including the O radical, are generated in the atmosphere air by the irradiated UV light.

Silicon radicals of the various radicals react with the O radicals (generated in the air by the UV light) to form an insulating film 104. The formation of the insulating film 104 using the organic silicon-containing thin film will be now described.

As shown in FIGS. 2A through 2I, the organic material thin films containing silicon, e.g., comprise polysiloxane cinnamate copolymer, polysiloxane cinnamate, poly (dimethylsiloxane), phenyl silane, N-(trimethylsilyl) acetamide, trimethylsilyl acetate, 1-(Trimethylsilyl-methyl)-urea, 1,4-Bis(trimethylsilyl)-benzene and 1, 4-Bis(trimethylsilyl)-1,3-butadiyne, respectively.

The organic material thin films containing silicon as described above have various bonds such as single or double bonds comprising O—O, O=O, O—H, C—C, C—H, C—O, C=C, C=O, N—H, C—N or Si—O etc.

Figure 2A:
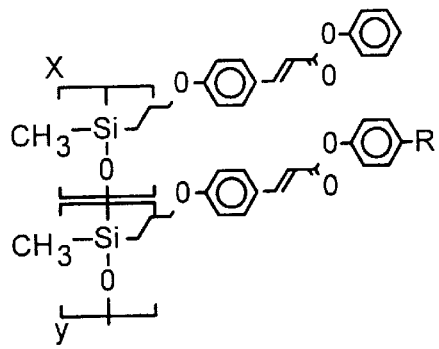
FIGS. 2A, 2B, 2C, 2D, 2E, 2F, 2G, 2H and 2I are structure formulae of an embodiment of the organic materials containing silicon according the invention.

As shown in FIG. 2A, in the Structure of polysiloxane cinnamate copolymer, x is included in the ranges of 2 to 50. y is included in the ranges of 2 to 50. R is included —$C_mH_{2+-1}$(m is included in the ranges of 1 to 12) or, —$C_lH_{2l+1}$(l is included in the ranges of 1 to 12), —Cl, —Br, —I.

Figure 2B:
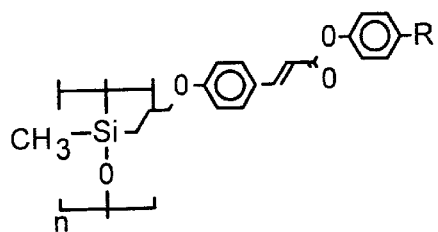
Figure 2C:
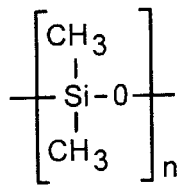
Figure 2D:
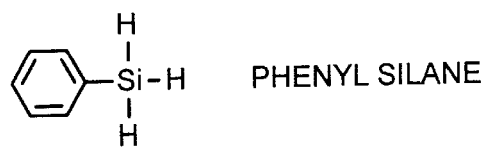
Figure 2E:
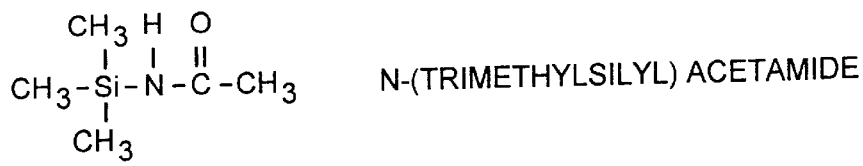
Figure 2F:
Figure 2G:
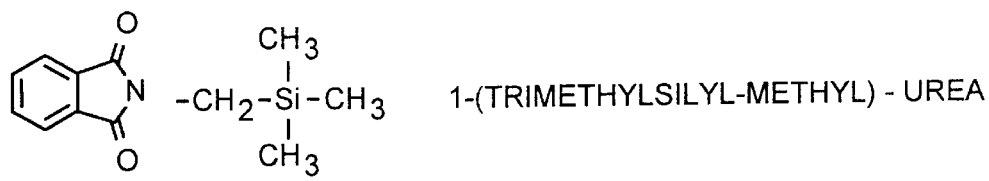
Figure 2H:
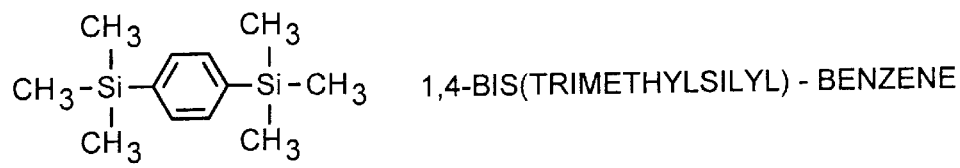
Figure 2I:
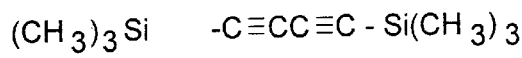
Figure 2I:

Also, as shown in FIG. 2B, in the structure of polysiloxane cinnamate, n is included in the ranges of 2 to 100. R is included —$C_mH_{2m+1}$(m is included in the ranges of 1 to 12) or, —$OC_lH_{2l+1}$(l is included in the ranges of 1 to 12), —Cl, —Br, —I.

The energy of UV light irradiated on the organic material thin films containing silicon is as follows:

$$E = Nhv = NhC/r \quad (1)$$

where,

N=6.022×10E23 /mol (N is Avogadro's number), h=6.626×10E-34 Js (h is Plank's constant), C=2.998×10E8 m/s (C is the velocity of light), and r is the wavelength of UV light.

According to the equation (1), the energy of UV light having the wavelength, e.g., of 172 nm is 695 kJ/mol.

$$O_2 \rightarrow O^- + O^- \quad (I)$$

$$O^- + O_2 \rightarrow O_3 \quad (II)$$

The oxygen molecules existing within the atmosphere of air or oxygen are decomposed or coupled by the energy of the UV light according to Equations (I) or(II):

The double bonding energy of oxygen molecules equals 490.4 kJ/mol and is much less than the energy of the UV light having the wavelength, e.g., of 172 nm generated from a UV lamp (i.e., 695 kJ/mol). Thus, the decomposition of the oxygen molecules easily takes place to generate $O_3$. Table 1 includes the bonding energy of double bonded oxygen atoms. The organic material thin films containing silicon are decomposed by the energy generated during UV light irradiation, in the same or similar manner to that described above. The C—H, C—C, C—O, C—N, O—H, P=O, O—O, Si—C, Si—H or Si—Si bonds of the molecules in the thin films are destroyed. The degree to which the bonds of thin films are destroyed depends on the respective bonding energies of molecules. In order to destroy bonds, an organic material thin film containing silicon is irradiated by energy larger than the bonding energy of the molecule. It is necessary to decompose different types of molecule bonds, and the respective bonding energies (in kJ/mol) are as follows.

TABLE 1

| bonding type | Bonding energy | bonding type | bonding energy |
|---|---|---|---|
| C—H | 413.4 | O—O | 138.4 |
| C—C | 347.7 | Si—C | 451.5 |
| C—O | 351.5 | Si—H | ≦299.2 |
| C—N | 291.6 | Si—Si | 326.8 ± 10 |
| O—H | 462.8 | O=O | 490.4 |

When light having energy larger than the bonding energy of molecules as shown in Table 1 is irradiated on the organic material thin films containing silicon, the bonds of molecules are destroyed and corresponding radicals are generated.

Thus, as shown in Table 1, since the respective bonding energies of molecules are lower than the energy of the incident UV light, the molecular bonds are easily destroyed. The organic material thin films containing silicon having C—H, C—N, C—C, C—O, Si—H or Si—C bonds decomposed under UV irradiation as follows:

$$\rightarrow C^- + H^- + O^- + N^- + Si^- \quad (III)$$

As shown in Equation (III), organic material thin films containing silicon, which have C—H, C—N, C—C, C—O, Si—H and/or Si—C bonds, are each decomposed into C, H, O, N and Si radicals. These radicals react as in Equation (IV), which follows.

$$C^- \rightarrow CO_2(g)$$

$$O^- \rightarrow O_2$$

$$H^- \rightarrow H_2O$$

$$N^· \rightarrow N_2(g) \text{ or } NH_3(g) \qquad (IV)$$

As shown in Equation (IV), the C, H, O or N radicals decomposed by UV light are reacted with the H, O or N radicals generated in Equations (I) or (III) to generate volatile $CO_2$, $O_2$, $H_2O$, $N_2$ or $NH_3$ gases. Then, the $CO_2$, $O_2$, $H_2O$, $N_2$ or $NH_3$ gases are removed from the insulating substrate 100.

On the other hand, the Si radicals are reacted with the O radical generated in (I) or (III) to generate, e.g., nonvolatile $SiO_2$, which remains on the insulating substrate 100. This is described in Equation (V), which follows.

$$Si^· + XO \rightarrow SiO_x \qquad (V)$$

According to the method of the invention, an organic material thin film containing silicon is decomposed into radicals by irradiating UV light of predetermined energy, in an atmosphere of air or oxygen. The different radicals, except Si radicals, are coupled with other components (which were decomposed by UV light in the atmosphere of air or oxygen) and removed as gases. However, the Si radicals react with O radicals in air to form an insulating film 104 such as $SiO_x$, where X=1 or 2.

As described above, according to the inventive method of forming insulation films for a liquid crystal display, it is possible to form insulating films without the need for an expensive apparatus or complicated processes.

Also, the invention makes it possible to form the insulating films in an atmosphere of air or oxygen without producing an additional vacuum state.

The invention has been illustrated via application to a liquid crystal display. The invention has broader applicability to forming insulating or protective layers for the gate and source/drain electrodes of the film transistors, not only as used in liquid crystal display devices, but also in other semiconductor devices.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method of forming insulating films for a liquid crystal display, comprising the steps of:

forming an organic silicon-containing thin film on an insulating substrate;

providing a gaseous oxidizing atmosphere to which the thin film is exposed;

destroying molecular bonds of the thin film to generate a plurality of radicals comprising Si radicals and O radicals by irradiating UV light onto the organic silicon-containing material thin film through said atmosphere; and forming the insulating films by reacting the Si radicals and O radicals.

2. The method of forming insulating films for a liquid crystal according to claim 1, wherein the gaseous atmosphere is one of air or oxygen.

3. The method of forming insulating films for a liquid crystal according to claim 1, wherein the step of irradiating produces the O radicals by decomposing the oxygen molecules in the atmosphere of air or oxygen.

4. The method of forming insulating films for a liquid crystal according to claim 1, wherein an energy of the UV light is larger than a bonding energy of molecules of the organic silicon-containing thin films.

5. The method of forming insulating films for a liquid crystal according to claim 4, wherein the UV light has a wavelength equal to or lower than 210 nm and a power equal to or higher than 30 W.

6. The method of forming insulating films for a liquid crystal according to claim 1, wherein the insulating films are silicon oxides.

7. The method of forming insulating films for a liquid crystal according to claim 1, wherein the organic material thin film includes at least one of polysiloxane cinnamate copolymer, polysiloxane cinnamate, poly(dimethylsiloxane), phenyl silane, N-(trimethylsilyl) acetamide, trimethylsilyl acetate, 1-(trimethylsilyl-methyl)-urea, and 1,4-Bis (trimethylsilyl)-benzene.

8. A method for forming a silicon oxide film, $SiO_x$, where X=1 or 2 on an electrode of a thin film transistor, the method comprising the steps of:

forming an electrode on a substrate;

forming an organic silicon-containing thin film on exposed surfaces of said electrode and said substrate;

providing a gaseous atmosphere of oxygen or air about said electrode and said substrate;

irradiating said thin film with ultra violet light to produce radicals, including silicon radicals, from said thin film and to produce oxygen radicals from said atmosphere; and reacting said silicon and oxygen radicals to form said silicon oxide film.

9. The method of claim 8, wherein said electrode is a gate electrode.

10. The method of claim 8, wherein said organic silicon-containing compound includes at least one of polysiloxane cinnamate copolymer, polysiloxane cinnamate, poly(dimethylsiloxane), phenyl silane, N-(trimethylsilyl) acetamide, trimethylsilyl acetate, 1-(trimethylsilyl-methyl)-urea, and 1,4-Bis(trimethylsilyl)-benzene.

11. The method of claim 8, wherein said step of irradiating uses light having a wavelength sufficient to deliver a quantity of energy that can break all molecular bonds in said thin film and in gas molecules in said atmosphere.

12. The method of claim 11, wherein a maximum wavelength in said light is less than or equals 210 nm.

13. The method of claim 8, wherein said substrate is an insulating substrate for a liquid crystal display device.

* * * * *